(12) United States Patent
Zhang et al.

(10) Patent No.: US 8,791,842 B2
(45) Date of Patent: Jul. 29, 2014

(54) METHOD AND APPARATUS FOR DECODING DATA IN PARALLEL

(71) Applicant: Huawei Technologies Co., Ltd., Guangdong (CN)

(72) Inventors: Yafan Zhang, Shanghai (CN); Jiaji Zhang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/848,471

(22) Filed: Mar. 21, 2013

(65) Prior Publication Data
US 2013/0278450 A1    Oct. 24, 2013

(30) Foreign Application Priority Data
Mar. 21, 2012    (CN) .......................... 2012 1 0076498

(51) Int. Cl.
*H03M 7/00*    (2006.01)

(52) U.S. Cl.
USPC ............. 341/50; 370/241; 370/335; 375/341; 375/253; 375/262; 375/265; 341/56; 341/76; 341/79

(58) Field of Classification Search
USPC ............... 341/50–90; 370/241, 335; 375/341, 375/253, 262, 265
See application file for complete search history.

(56) References Cited

U.S. PATENT DOCUMENTS

| | | | |
|---|---|---|---|
| 7,929,646 B2 * | 4/2011 | Chen et al. ..................... | 375/341 |
| 8,464,139 B2 * | 6/2013 | Miyazaki et al. ............. | 714/776 |
| 2005/0149836 A1 * | 7/2005 | Tanaka ......................... | 714/794 |
| 2007/0177696 A1 * | 8/2007 | Chen et al. ..................... | 375/341 |
| 2008/0316977 A1 | 12/2008 | Malladi | |
| 2011/0280133 A1 | 11/2011 | Chang et al. | |

FOREIGN PATENT DOCUMENTS

CN    101743711 A    6/2010

OTHER PUBLICATIONS

"3rd Generation Partnership Project; Technical Specification Group Radio Access Network; Multiplexing and Channel Coding (FDD); (Release 10)," Dec. 2010, TS 25.212, V10.1.0, 3GPP, Valbonne, France.
Extended European Search Report in corresponding European Patent Application No. 13160354.0 (Jul. 24, 2013).
Lee et al., "A Design of High-Performance Pipelined Architecture for H.264/AVC CAVLC Decoder and Low-Power Implementation," 2010, IEEE, New York, New York.
Yoshizawa et al., "A Complete Pipelined MMSE Detection Architecture in a 4x4 MIMO-OFDM Receiver," 2008, IEEE, New York, New York.

* cited by examiner

*Primary Examiner* — Lam T Mai
(74) *Attorney, Agent, or Firm* — Leydig, Voit & Mayer, Ltd.

(57) ABSTRACT

Embodiments of the present invention disclose a data decoding method and apparatus, relate to the field of wireless communications, and can improve a resource utilization rate in a decoding process, thereby improving decoding efficiency. The method of the present invention includes: dividing a to-be-decoded data transport block into N code blocks, where N is an integer greater than or equal to 2; and decoding the N code blocks in parallel according to a reverse direction of encoding. The present invention is applicable to data decoding.

9 Claims, 4 Drawing Sheets

METHOD AND APPARATUS FOR DECODING DATA IN PARALLEL

CROSS-REFERENCE TO RELATED APPLICATIONS

This application claims priority to Chinese Patent Application No. 201210076498.0, filed on Mar. 21, 2012, which is hereby incorporated by reference in its entirety.

FIELD OF THE INVENTION

The present invention relates to the field of wireless communications, and in particular, to a data decoding method and apparatus.

BACKGROUND OF THE INVENTION

With the rapid development of wireless communication technologies, data traffic in a wireless network is gradually increased, resulting in an increasing amount of data to be decoded by a mobile terminal within a unit time, so the mobile terminal is required to decode the data in a more high-efficient decoding manner.

An existing decoding manner is mainly stepwise decoding, for example:

An HS-DSCH (High Speed Downlink Shared Channel, high speed downlink shared channel) is a channel that is applied in WCDMA (Wideband Code Division Multiple Access, wideband code division multiple access), and a decoding manner on the HS-DSCH substantially is: dividing execution steps involved in a whole decoding process into multiple decoding units having a certain sequence, and at the same time, dividing to-be-decoded data into multiple transport blocks (Transport Block). As shown in FIG. 1, in a decoding process of WCDMA, a transport block is placed in a decoding unit 1 first, and the decoding unit 1 performs data decoding on the transport block by using a corresponding decoding resource (a hardware device, and so on); after completing decoding, the decoding unit 1 transfers the transport block that has undergone data decoding to a decoding unit 2 for data decoding, and at the same time, the decoding unit 1 starts to decode a next transport block, that is, after a previous decoding unit completes decoding of a whole transport block, a next decoding unit starts to work, till a transport block is decoded by all decoding units, and after all transport blocks have been decoded by all the decoding units, data decoding is ended. During the data decoding, time required for each decoding unit to perform data decoding is different, when a decoding unit that requires a long time decodes a transport block, if a next decoding unit has already completed data decoding on a previous transport block, the next decoding unit enters a wait state before receiving a transport block transferred by the previous decoding unit.

The prior art at least has the following problems:

By adopting the existing stepwise decoding manner, only after being decoded by a previous decoding unit, data of each transport block can continue to be decoded by a next decoding unit. Because time required for each decoding unit to perform data decoding is different, when a decoding unit requiring a long time decodes a transport block, a subsequent decoding unit gets into an idle situation or a waiting situation, resulting in a low decoding resource utilization rate and low decoding efficiency.

SUMMARY OF THE INVENTION

Embodiments of the present invention provide a data decoding method and apparatus, which can improve a resource utilization rate in a decoding process, thereby improving decoding efficiency.

In order to achieve the foregoing objectives, the embodiments of the present invention adopt the following technical solutions:

In one aspect, an embodiment of the present invention provides a data decoding method, including:

dividing a to-be-decoded data transport block into N code blocks, where N is an integer greater than 2; and decoding the N code blocks in parallel according to a reverse direction of encoding.

In another aspect, an embodiment of the present invention provides a data decoding apparatus, including:

a transport block division module, configured to divide a to-be-decoded data transport block into N code blocks, where N is an integer greater than 2; and a code block decoding module, configured to decode the N code blocks in parallel according to a reverse direction of encoding.

According to the data decoding method and apparatus provided by the embodiments of the present invention, to-be-decoded data that has been divided into transport blocks is further divided into code blocks, and the to-be-decoded data is decoded with a code block as a unit, so that multiple parts of a decoding device can perform data decoding on one transport block at the same time (that is, the decoding device can simultaneously decode different code blocks obtained by dividing a same transport block), thereby avoiding an idle situation or a waiting situation into which the decoding device gets when decoding is performed with a transport block as a unit. As compared with the prior art, the embodiments of the present invention can avoid the idle situation or waiting situation into which the decoding device gets during a data decoding process, thereby improving the resource utilization rate in the decoding process and improving the decoding efficiency.

BRIEF DESCRIPTION OF THE DRAWINGS

To illustrate the technical solutions in the embodiments of the present invention more clearly, accompanying drawings required for describing the embodiments or the prior art are briefly introduced in the following. Apparently, the accompanying drawings in the following description merely show some embodiments of the present invention, and persons of ordinary skill in the art may still derive other drawings from these accompanying drawings without creative efforts.

DETAILED DESCRIPTION OF THE EMBODIMENTS

The technical solutions in the embodiments of the present invention are clearly and completely described in the following with reference to the accompanying drawings in the embodiments of the present invention. Apparently, the embodiments to be described are merely part rather than all of the embodiments of the present invention. All other embodiments obtained by persons of ordinary skill in the art based on the embodiments of the present invention without creative effects shall fall within the protection scope of the present invention.

To make the advantages of the technical solutions of the present invention clearer, the present invention is described in detail with reference to the accompanying drawings and embodiments.

Embodiment 1

Figure 1:
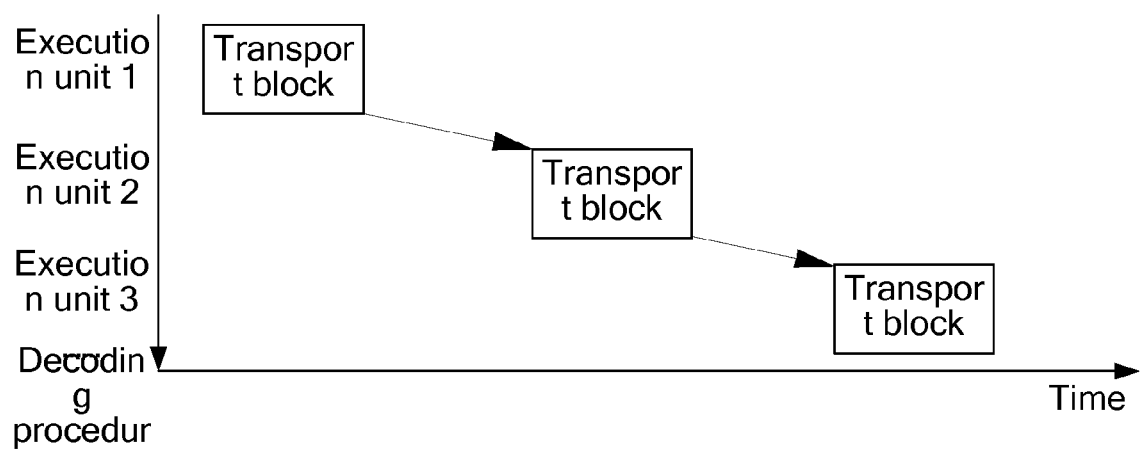
FIG. 1 is a schematic flow chart of a decoding process in the prior art.
Figure 2:
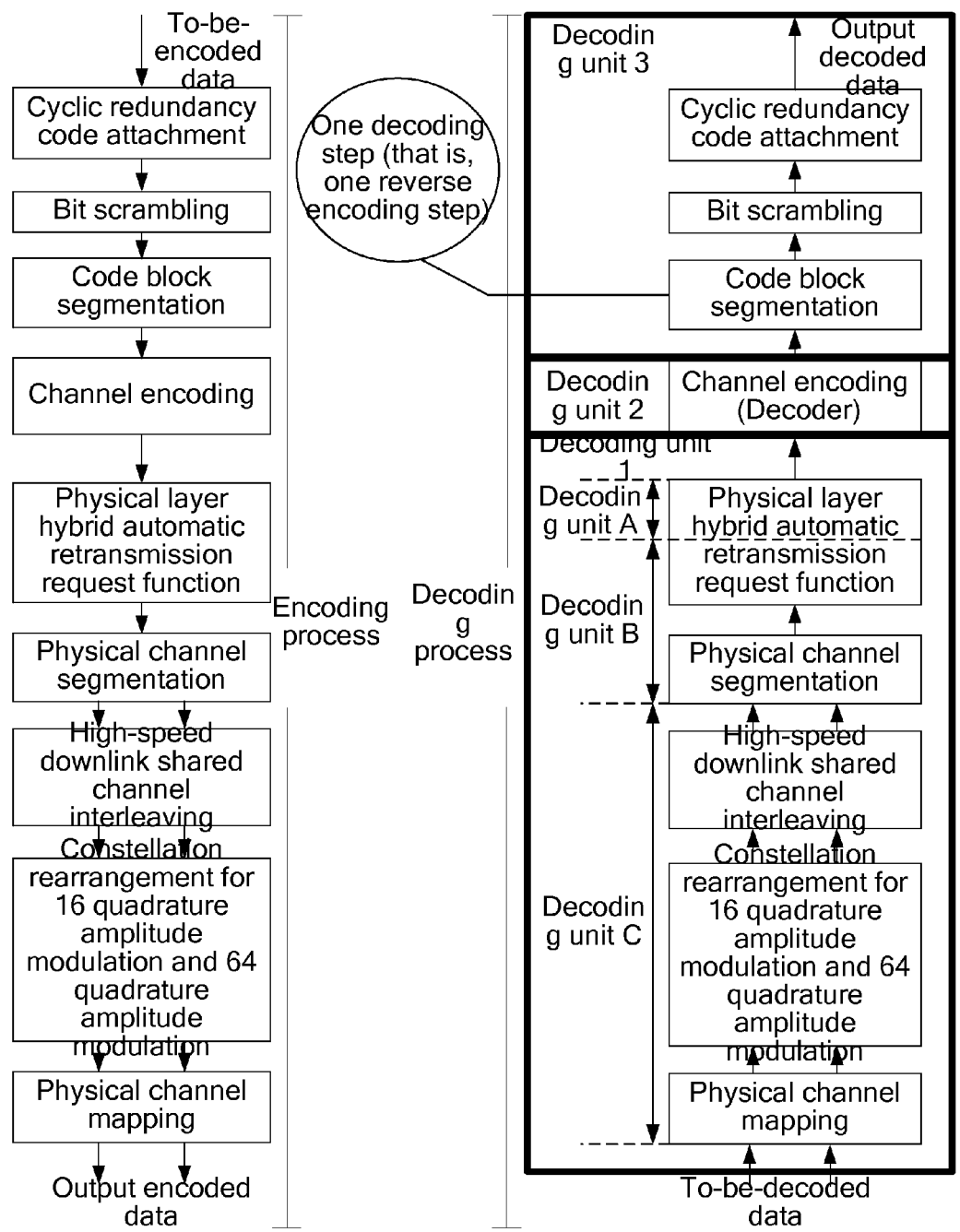
FIG. 2 is a schematic flow chart of a specific decoding process according to the present invention.
Figure 3:
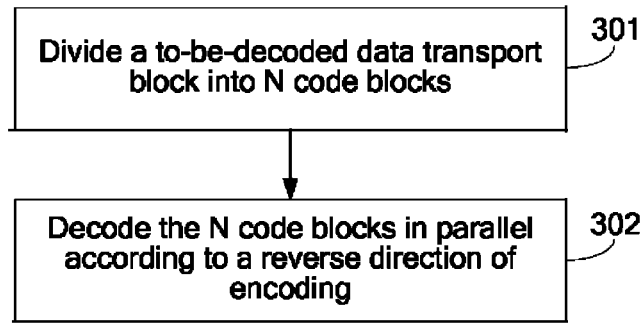
FIG. 3 is a flow chart of a data decoding method according to Embodiment 1 of the present invention.

An embodiment of the present invention provides a data decoding method. As shown in FIG. 3, the method includes:

In an actual application, a data decoding procedure may be divided into multiple decoding units, for example, as shown in FIG. 2, an encoding process and a decoding process that are applied to an HS-DSCH channel (adopting the 3GPP/25.212 protocol) of a WCDMA transmitter is shown, where a decoding process of a receiving end is a reverse process of an encoding process. According to a decoding procedure sequence, a decoding function may be divided into multiple decoding units. After a previous decoding unit completes data decoding on a transport block or a code block, a next decoding unit receives a data decoding result of the previous decoding unit and starts to work, for example, the decoding function may be divided into three decoding units shown in FIG. 2.

After to-be-decoded data (that is, an encoding result finally obtained through a complete encoding process) undergoes data decoding of all the three decoding units, decoding of the data is ended, and decoded data (a decoding result finally obtained) is output. A specific division manner of the decoding units may be any implementation manner that is well known to persons of ordinary skill in the art, and is not described herein again.

Step 301: Divide a to-be-decoded data transport block into N code blocks.

N is an integer greater than 2.

In the present invention, the step may be executed by a receiving end, where the receiving end is a device that needs to perform a decoding process in a communication system, such as a server or a terminal device for receiving information sent by a sending end, and the sending end may be a device that needs to perform an encoding process in the communication system, such as a terminal device or a base state for sending information to the receiving end.

Specifically, in this embodiment, after receiving the encoded data (that is, to-be-decoded data) sent by the sending end, the receiving end divides the to-be-decoded data into at least one transport block of a specified size. A specific manner of receiving the to-be-decoded data and dividing the to-be-decoded data into transport blocks may be any implementation manner that is well known to persons of ordinary skill in the art, and is not described herein again. After dividing the to-be-decoded data into transport blocks, the receiving end further divides all the divided transport blocks into code blocks. For example, after dividing the to-be-decoded data into three transport blocks, the receiving end further divides the three transport blocks into code blocks, where each transport block is divided into three code blocks, that is, the receiving end divides the to-be-decoded data into nine code blocks finally. A specific manner of dividing the transport block into code blocks may be any implementation manner that is well known to persons of ordinary skill in the art, and is not described herein again.

Step 302: Decode the N code blocks in parallel according to a reverse direction of encoding.

Specifically, in this embodiment, after dividing the to-be-decoded data into code blocks, the receiving end decodes the code blocks successively, and after decoding the last code block, the receiving end completes decoding of the to-be-decoded data.

According to the data decoding method provided by the embodiment of the present invention, to-be-decoded data that has been divided into transport blocks is further divided into code blocks, and the to-be-decoded data is decoded with a code block as a unit, so that multiple parts of a decoding device can perform data decoding on one transport block at the same time, thereby avoiding an idle situation or a waiting situation into which the decoding device gets when decoding is performed with the transport block as a unit. As compared with the prior art, the embodiments of the present invention can avoid the idle situation or waiting situation into which the decoding device gets during data decoding, thereby improving a resource utilization rate in the decoding process and improving decoding efficiency.

Embodiment 2

Figure 4:
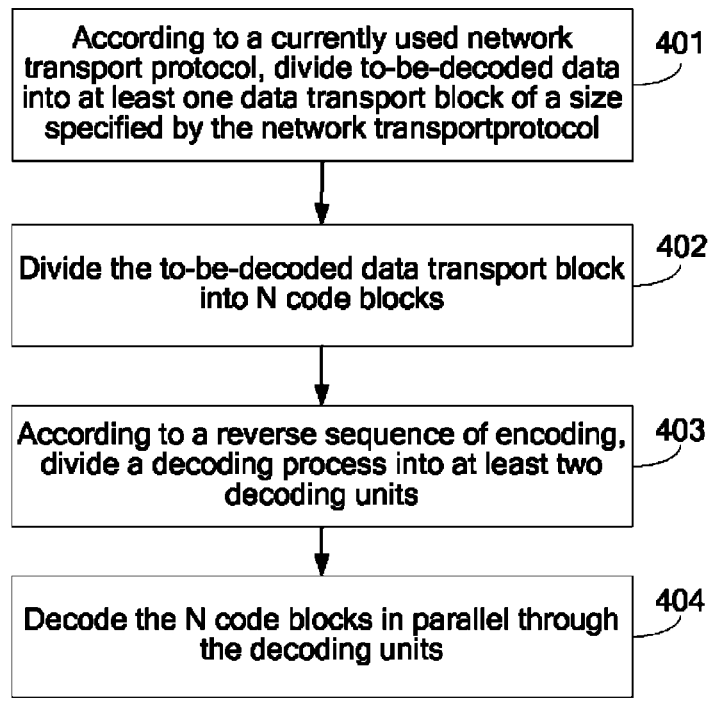
FIG. 4 is a flow chart of a data decoding method according to Embodiment 2 of the present invention.

An embodiment of the present invention provides a data decoding method. As shown in FIG. 4, the method includes:

Step 401: According to a currently used network transport protocol, divide to-be-decoded data into at least one data transport block of a size specified by the network transport protocol.

Specifically, in this embodiment, after receiving to-be-decoded data that is sent by a sending end, a receiving end divides, according to a currently used network transport protocol, the to-be-decoded data into at least one data transport block of a size specified by the network transport protocol.

Step 402: Divide a to-be-decoded data transport block into N code blocks.

N is an integer greater than 2.

Step 403: According to a reverse sequence of encoding, divide a decoding process into at least two decoding units.

As shown in FIG. 2, any decoding unit includes one or more decoding steps, where any decoding step is decoding in a reverse direction of an encoding step, and decoding processing on one code block can be completed in each decoding unit.

Further, as shown in FIG. 2, when the to-be-decoded data is encoded in the form of a TURBO code, a second decoding unit includes a TURBO decoder, a decoding step before the TURBO decoder is defined as a first decoding unit according to the timing of calculation and storage, and a decoding step after the TURBO decoder is defined as a third decoding unit according to the timing of calculation and storage. The specific amount of the decoding units may be adjusted according to a use environment, and is not limited to three. For example, as shown in FIG. 2, in an actual application, the data decoding process may be divided into five decoding units, namely, a decoding unit A, a decoding unit B, a decoding unit C, a decoding unit 2 and a decoding unit 3, where the decoding unit A, the decoding unit B and the decoding unit C are almost started at the same time (where a time delay can be ignored) in an actual application, that is, in a conventional use process, it can be regarded that the decoding unit A, the decoding unit B and the decoding unit C decode one code block at the same time, thereby saving time required for decoding.

Step 404: Decode the N code blocks in parallel through the decoding units.

Figure 5:
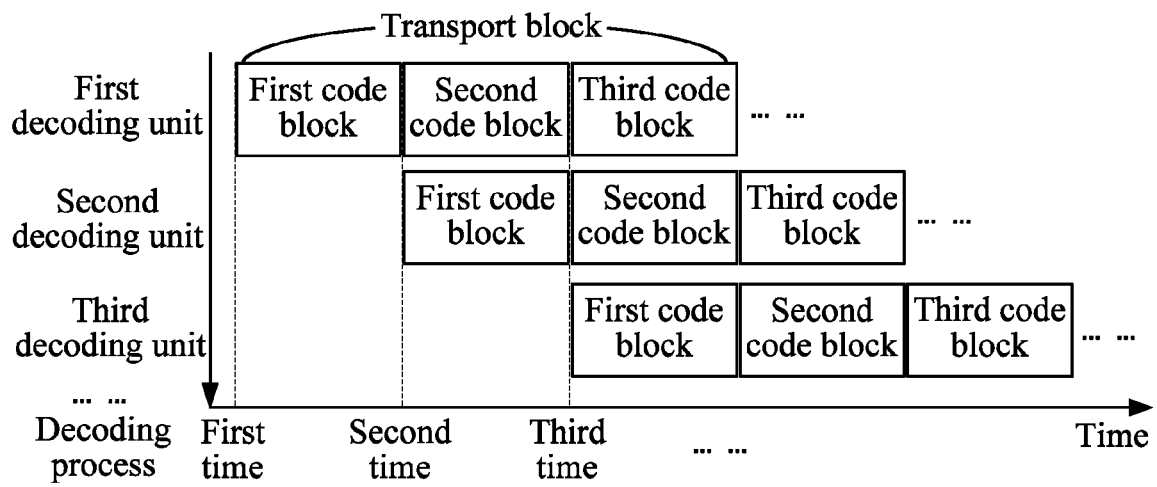
FIG. 5 is a schematic flow chart of a specific decoding process according to Embodiment 2 of the present invention.

A parallel decoding procedure is:

As shown in FIG. 5, at a first decoding time, a first code block is decoded in a first decoding unit; at a second decoding time, a second code block is decoded in the first decoding unit, and the first code block is decoded in a second decoding unit; and at a third decoding time, the second code block is decoded in the second decoding unit, and a third code block is decoded in the first decoding unit, till decoding processing on all the N code blocks is completed in every decoding unit. For example:

A receiving end divides to-be-decoded data into transport block 1, transport block 2 and transport block 3, where transport block 1 is further divided into code block 1, code block 2 and code block 3, transport block 2 is further divided into code block 4, code block 5 and code block 6, and transport block 3 is further divided into code block 7, code block 8 and code block 9. The divided nine code blocks are successively decoded by the decoding units shown in FIG. 2, where after completing decoding of one code block, one decoding unit transfers the code block to a next decoding unit, and the next decoding unit decodes the code block. For example, after completing decoding of code block 1, the decoding unit 1 transfers the code block 1 that has been decoded by the decoding unit 1 to the decoding unit 2, and the decoding unit 2 performs data decoding; and at the same time, the decoding unit 1 continues to decode code block 2, till all the decoding units complete decoding of code block 1. Similarly, data decoding is performed on the rest 8 code blocks successively, after the last code block is decoded by the decoding unit 3, the receiving end completes decoding of the to-be-decoded data.

During the foregoing data decoding process, because each transport block is further divided into multiple code blocks, the multiple decoding units may simultaneously decode different code blocks obtained by dividing a same transport block. For example, after completing decoding of code block 1, the decoding unit 1 transfers code block 1 to the decoding unit 2 for data decoding, and at the same time, the decoding unit 1 continues to decode code block 2. That is, while the decoding unit 1 performs data decoding on code block 2, the decoding unit 2 performs data decoding on code block 1. Because code block 1 and code block 2 are both obtained by dividing transport block 1, the decoding unit 1 and the decoding unit 2 in the receiving end perform data decoding on transport block 1 at the same time, so that an idle situation or a waiting situation into which a decoding device gets when the to-be-decoded data is decoded with a transport block as a unit in the prior art is avoided, thereby improving a utilization rate of the decoding device in the decoding process, and improving decoding efficiency. For example:

Delay time required for decoding the to-be-decoded data with the transport block as a unit is approximately estimated as follows:

assume that the time for the decoding unit 1 to process one transport block is: Tp time for the decoding unit 2 to process one transport block (a decoding device corresponding to the decoding unit 2 is a TURBO decoder, and the decoder adopts four iterations) is: 4Tp time for the decoding unit 3 to process one transport block is: Tp then total time required for decoding one transport block is:

$$Tp+4Tp+Tp=6Tp$$

Delay time required for decoding the to-be-decoded data with a code block as a unit is approximately estimated as follows:

that one transport block is divided into three code blocks is used as an example, time for the decoding unit 1 to process one code block is: ⅓*Tp time for the decoding unit 2 to process one transport block is (in an actual application, time for the TURBO decoder to process one code block by adopting four 4 iterations is the same as time for the TURBO decoder to process one transport block): 4Tp time for the decoding unit 3 to process one code block is:

$$\frac{1}{3}*Tp = \frac{1}{3}*Tp + 4Tp + \frac{1}{3}*Tp$$
$$= 4.67Tp$$

so the delay time caused by performing data decoding with the code block as a unit is less than that caused by perform data decoding with the transport block as a unit.

Further, during a process of decoding data on the receiving end, it is required to occupy storage resources of the decoding device to store the data. For example, after the decoding unit 2 receives code block 1, the decoding unit 2 may first store code block 1 in a RAM (Random Access Memory, random access memory) of a decoding device corresponding to the decoding unit 2, and then the decoding unit 2 decodes code block 1, so the size of the occupied RAM is the size of one code block, while when decoding is performed with the transport block as a unit, the size of the occupied RAM is the size of one transport block. Therefore, when the to-be-decoded data is decoded with the code block as a unit, occupied storage resources is reduced by folds, as compared with resources occupied when the to-be-decoded data is decoded with the transport block as a unit, and the receiving end may use saved storage resources to process more data, thereby further improving a resource utilization rate in the decoding process.

According to the data decoding method provided in the embodiment of the present invention, the to-be-decoded data that has been divided into transport blocks is further divided into code blocks, and the to-be-decoded data is decoded with the code block as a unit, so that data decoding can be performed on one transport block by multiple decoding units at the same time (that is, multiple decoding units may simultaneously decode different code blocks obtained by dividing a same transport block), thereby avoiding an idle situation or a waiting situation into which a decoding device corresponding to a subsequent decoding unit gets when decoding is performed with the transport block as a unit. As compared with the prior art, the embodiment of the present invention can avoid the idle situation or waiting situation into which a decoding device corresponding to a decoding unit gets during data decoding, thereby improving the resource utilization rate in the decoding process and improving the decoding efficiency.

Embodiment 3

Figure 6:
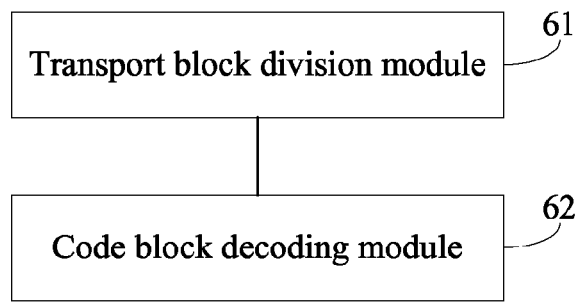
FIG. 6 is a schematic structural diagram of a data decoding apparatus according to Embodiment 3 of the present invention.

An embodiment of the present invention provides a data decoding apparatus. As shown in FIG. 6, the apparatus includes:

a transport block division module 61, configured to divide a to-be-decoded data transport block into N code blocks, where N is an integer greater than 2; and a code block decoding module 62, configured to decode the N code blocks in parallel according to a reverse direction of encoding.

According to the data decoding apparatus provided by the embodiment of the present invention, the transport block division module further divides to-be-decoded data that has been divided into transport blocks into code blocks, and the code block decoding module decodes the to-be-decoded data with a code block as a unit, so that multiple parts of a decoding device can perform data decoding on a transport block at the same time, thereby avoiding an idle situation or a waiting situation into which the decoding device gets when decoding is performed with the transport block as a unit. As compared with the prior art, the embodiment of the present invention can avoid the idle situation or waiting situation into which the decoding device gets during data decoding, thereby improving a resource utilization rate in the decoding process and improving decoding efficiency.

Embodiment 4

Figure 7:
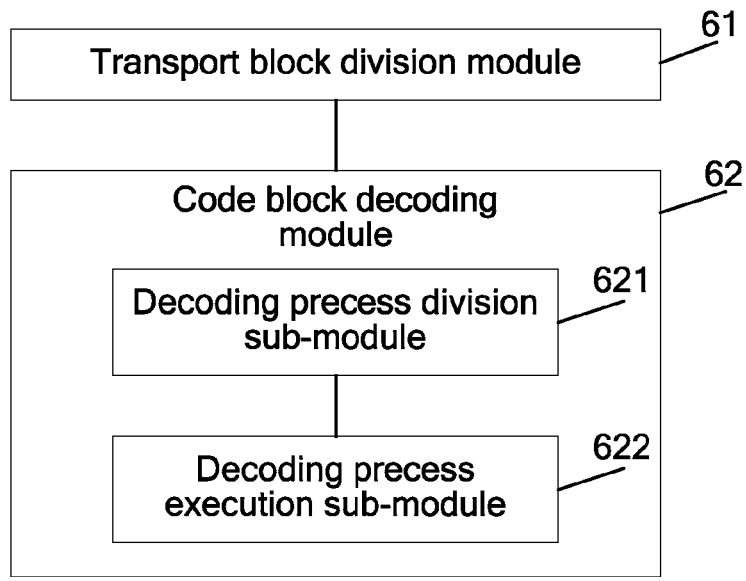
FIG. 7 is a schematic structural diagram of a data decoding apparatus according to Embodiment 4 of the present invention.

An embodiment of the present invention provides a data decoding apparatus. As shown in FIG. 7, the apparatus includes:

a transport block division module 61, configured to divide a to-be-decoded data transport block into N code blocks, where N is an integer greater than 2; and a code block decoding module 62, configured to decode the N code blocks in parallel according to a reverse direction of encoding.

The code block decoding module 62 includes:

a decoding process division sub-module 621, configured to divide a decoding process into at least two decoding units according to a reverse sequence of encoding, where decoding processing on one code block can be completed in each decoding unit;

where any decoding unit includes one or more decoding steps, and any decoding step is decoding in a reverse direction of an encoding step; and a decoding process execution sub-module 622, configured to:

at a first decoding time, decode a first code block in a first decoding unit; at a second decoding time, decode a second code block in the first decoding unit, and decode the first code block in a second decoding unit; at a third decoding time, decode the second code block in the second decoding unit, and decode a third code block in the first decoding unit, till decoding processing on all the N code blocks is completed in every decoding unit.

When the to-be-decoded data is encoded in the form of a TURBO code, the second decoding unit includes a TURBO decoder, and the decoding process further includes a third decoding unit.

A decoding step before the TURBO decoder is defined as the first decoding unit according to the timing of calculation and storage, and a decoding step after the TURBO decoder is defined as the third decoding unit according to the timing of calculation and storage.

At the third decoding time, the first code block is decoded in the third decoding unit.

According to the data decoding apparatus provided in the embodiment of the present invention, the transport block division module further decodes the transport block into code blocks, and the code block decoding module decodes the to-be-decoded data with a code block as a unit, so that data decoding can be performed on one transport block by multiple decoding units at the same time (that is, multiple decoding units may simultaneously decode different code blocks obtained by dividing a same transport block), thereby avoiding an idle situation or a waiting situation into which a decoding device corresponding to a subsequent decoding unit gets when decoding is performed with the transport block as a unit. As compared with the prior art, the embodiment of the present invention can avoid the idle situation or waiting situation into which a decoding device corresponding to a decoding unit gets during data decoding, thereby improving a resource utilization rate in the decoding process and improving decoding efficiency.

Persons of ordinary skill in the art may understand that implementation of all or part of the procedures of the methods in the foregoing embodiments may be completed by a computer program instructing relevant hardware. The program may be stored in a computer readable storage medium. When the program is run, the procedures of the foregoing method embodiments are performed. The storage medium may be a magnetic disk, an optical disk, a read-only memory (Read-Only Memory, ROM), a random access memory, or the like.

The foregoing descriptions are merely specific implementation manners of the present invention, but are not intended to limit the protection scope of the present invention. Any variation or replacement readily figured out by persons skilled in the art within the technical scope of the present invention shall fall within the protection scope of the present invention. Therefore, the protection scope of the present invention shall be subject to the protection scope of the appended claims.

What is claimed is:

1. A decoding method, for decoding channel encoded data, comprising:

dividing a to-be-decoded data transport block into N code blocks, wherein N is an integer greater than or equal to 2; and decoding the N code blocks in parallel according to a reverse direction of encoding;

wherein the step of decoding the N code blocks in parallel according to the reverse direction of encoding comprises:

dividing a decoding process into at least two decoding sub-process according to a reverse sequence of encoding, wherein decoding processing on at least one code block can be completed in each decoding sub-process; and decoding the N code blocks in the at least two decoding sub-processes, wherein at a first decoding time, decoding a first code block in a first decoding sub-process;

at a second decoding time, decoding a second code block in the first decoding sub-process, and decoding, the first code block in a second decoding sub-process; and at a third decoding time, decoding the second code block in the second decoding sub-process;

till decoding of the N code blocks is completed in every decoding sub-process.

2. The decoding method according to claim 1, wherein in the step of dividing the decoding process into at least two decoding sub-processes according to the reverse sequence of encoding, any decoding sub-process comprises one or more decoding steps, and any decoding step is decoding in a reverse direction of an encoding step.

3. The decoding method according to claim 1, wherein when the to-be-decoded data is encoded in a form of a TURBO code, the decoding process further comprises a third decoding sub-process;

the second decoding sub-process comprises a TURBO decoder;

a decoding step before the TURBO decoder is defined as the first decoding sub-process according to timing of calculation and storage, and a decoding step after the TURBO decoder is defined as the third decoding sub-process according to timing of calculation and storage.

4. The decoding method according to claim 3, wherein at the third decoding time, the first code block is decoded in the third decoding sub-process; and at a fourth decoding time, the second code block is decoded in the third decoding sub-process.

5. A decoding apparatus, for decoding channel encoded data, comprising:

a transport block division module, configured to divide a to-be-decoded data transport block into N code blocks, wherein N is an integer greater than 2; and a code block decoding module, configured to decode the N code blocks in parallel according to a reverse direction of encoding;

wherein the code block decoding module comprises:

a decoding process division sub-module configured to divide a decoding process into at least two decoding sub-processes according to a reverse sequence of encoding, wherein decoding processing on one code block can be completed in each decoding sub-process;

a decoding process execution sub-module, configured to at a first decoding time, decode a first code block in a first decoding sub-process;

at a second decoding time decode a second code block in the first decoding sub-process, and decode the first code block in a second decoding sub-process; and at a third decoding time decode the second data block in the second decoding sub-process, and decode a third code block in the first decoding sub-process;

till decoding processing on all the N code blocks is completed in every decoding sub-process.

6. The decoding apparatus according to claim 5, wherein in the step that the decoding process division sub-module divides the decoding process into at least two decoding sub-processes, any decoding sub-process comprises one or more decoding steps, and any decoding step is decoding in a reverse direction of an encoding step.

7. The decoding apparatus according to claim 5, wherein when the to-be-decoded data is encoded in a form of a TURBO code, the second decoding sub-process comprises a TURBO decoder, and the decoding process further comprises a third decoding sub-process;

a decoding step before the TURBO decoder is defined as the first decoding sub-process according to timing of calculation and storage, and a decoding step after the TURBO decoder is defined as the third decoding sub-process according to timing of calculation and storage.

8. The decoding apparatus according to claim 5, wherein at the third decoding time, the first code block is decoded in the third decoding sub-process.

9. The decoding apparatus according to claim 7, wherein at the third decoding time, the first code block is decoded in the third decoding sub-process.

* * * * *